(12) United States Patent
Takahashi et al.

(10) Patent No.: US 6,194,896 B1
(45) Date of Patent: Feb. 27, 2001

(54) METHOD OF CONTROLLING MAGNETIC CHARACTERISTICS OF MAGNETORESISTIVE EFFECT ELEMENT AND OF MAGNETIC HEAD WITH THE ELEMENT, MAGNETIC HEAD DEVICE WITH MAGNETORESISTIVE EFFECT ELEMENT, AND MAGNETIC DISK UNIT WITH THE DEVICE

(75) Inventors: Masato Takahashi; Toshiaki Maeda; Kenji Inage, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/291,376

(22) Filed: Apr. 14, 1999

(30) Foreign Application Priority Data

Apr. 20, 1998 (JP) .................................................. 10-123861

(51) Int. Cl.$^7$ .................................................. G01R 33/02
(52) U.S. Cl. ........................................ 324/252; 360/324.1
(58) Field of Search ............................... 324/252, 207.21; 360/75, 314, 324, 324.1, 313, 324.11; 338/32 R

(56) References Cited

U.S. PATENT DOCUMENTS

| | | | |
|---|---|---|---|
| 5,206,590 | 4/1993 | Dieny et al. ......................... | 324/252 |
| 5,422,571 | 6/1995 | Gurney et al. ....................... | 324/252 |
| 5,442,508 | * 8/1995 | Smith .................................. | 360/314 |
| 5,650,887 | 7/1997 | Dovek et al. ........................ | 360/75 |
| 5,998,040 | * 12/1999 | Nakatani et al. .................... | 428/611 |

* cited by examiner

*Primary Examiner*—Jay Patidar
(74) *Attorney, Agent, or Firm*—Arent Fox Kintner Plotkin & Kahn, PLLC

(57) ABSTRACT

A method of controlling magnetic characteristics of a MR element and a method of controlling magnetic characteristics of a magnetic head with the MR element utilizing exchange coupling magnetization, include a step of supplying discrete rectangular waveform currents or a rectangular waveform current to the MR element so as to generate magnetic field in a desired direction and to generate joule heat, the generated magnetic field and the generated joule heat being applied to the MR element, and a step of controlling a duty ratio of the discrete rectangular waveform currents or a time constant of the falling of the rectangular waveform current so that a temperature of the MR element is controlled under a desired temperature change characteristics, whereby a magnetization direction caused by the exchange coupling in the MR element is aligned to a desired direction.

34 Claims, 12 Drawing Sheets

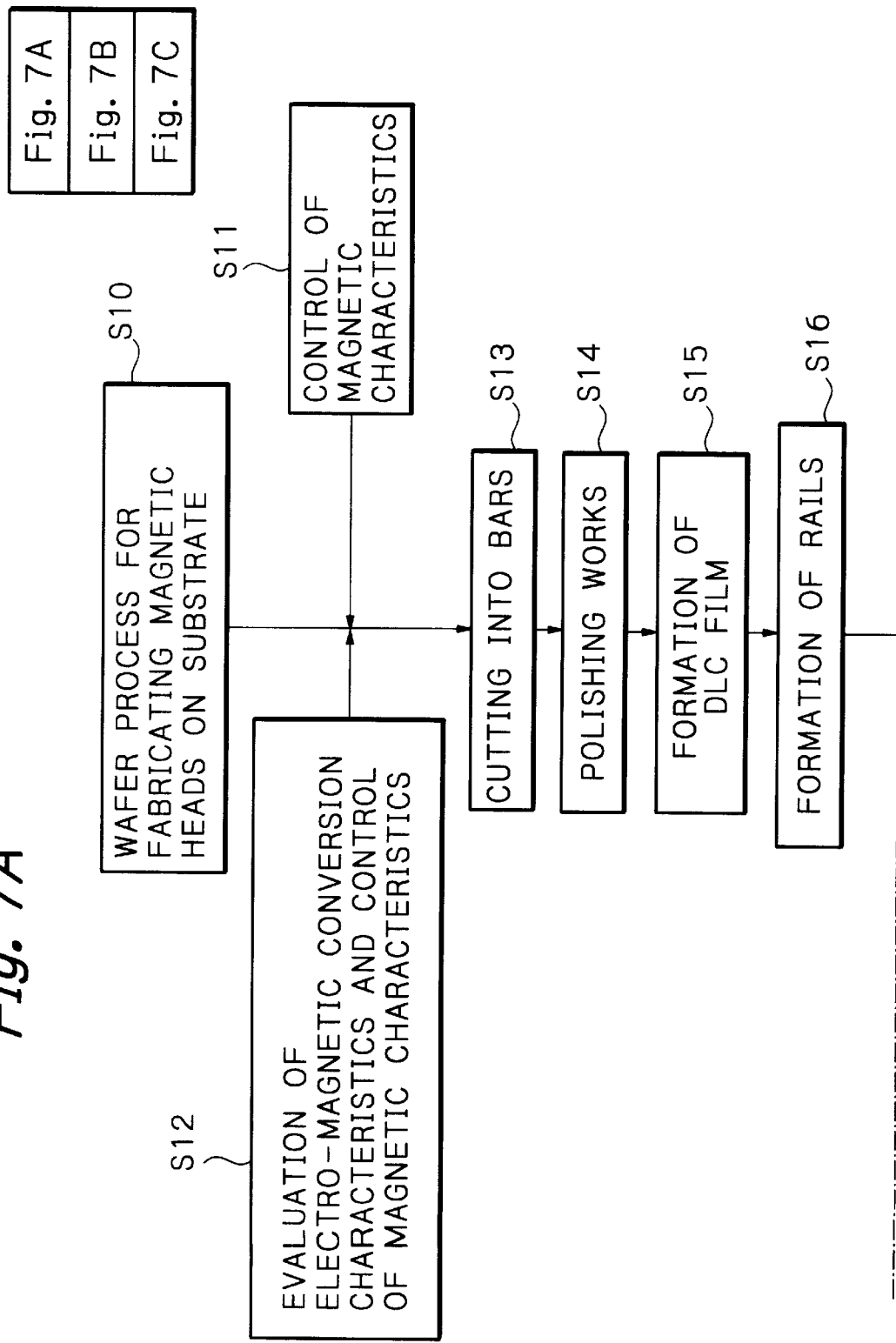

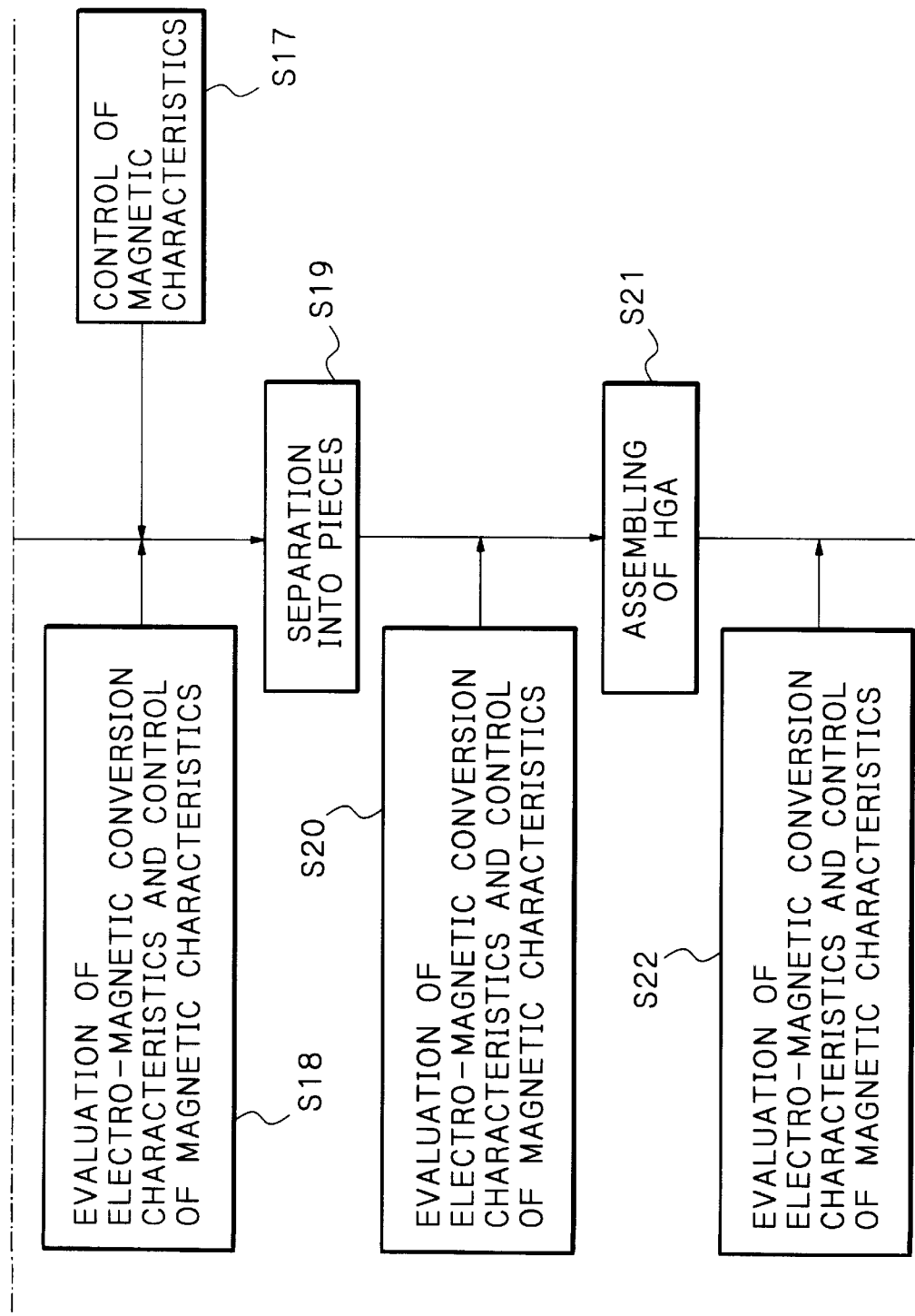

METHOD OF CONTROLLING MAGNETIC CHARACTERISTICS OF MAGNETORESISTIVE EFFECT ELEMENT AND OF MAGNETIC HEAD WITH THE ELEMENT, MAGNETIC HEAD DEVICE WITH MAGNETORESISTIVE EFFECT ELEMENT, AND MAGNETIC DISK UNIT WITH THE DEVICE

FIELD OF THE INVENTION

The present invention relates to a method of controlling magnetic characteristics of a magnetoresistive effect (MR) element biased by an anti-ferromagnetic material layer, for example, a giant magnetoresistive effect (GMR) element such as a spin valve MR element, or a tunneling magnetoresistive effect (TMR) element. The present invention also relates to a method of controlling magnetic characteristics of a magnetic head with the MR element, a magnetic head device with the MR element, and a magnetic disk unit with the device.

DESCRIPTION OF THE RELATED ART

Recently, thin film magnetic heads with MR elements based on spin valve of GMR characteristics are proposed in for example U.S. Pat. Nos. 5,206,590 and 5,422,571, in order to satisfy the requirement for ever increasing data storage densities in today's magnetic storage systems like magnetic disk units. The spin valve thin film structure includes first and second thin film layers of a ferromagnetic material separated by a thin film layer of non-magnetic conductive material, and an adjacent layer of anti-ferromagnetic material is formed in physical contact with the second ferromagnetic layer to provide exchange coupling bias magnetic field by exchange coupling at the interface of the layers. The magnetization direction in the second ferromagnetic layer is constrained or maintained by the exchange coupling, hereinafter the second layer is called "pinned" layer. On the other hand, the magnetization direction of the first ferromagnetic layer is free to rotate in response to an externally applied measurement magnetic field, hereinafter the first layer is called "free" layer. The direction of the magnetization in the free layer changes between parallel and anti-parallel against the direction of the magnetization in the pinned layer, and hence the magnetoresistive effect greatly changes and GMR characteristics are obtained.

The output characteristic of the spin valve MR element depends upon the angular difference of magnetization between the free and pinned layers. The direction of the magnetization of the free layer is free to rotate in accordance with an external magnetic field. That of the pinned layer is fixed to a specific direction by the exchange coupling between the layer and adjacently formed anti-ferromagnetic layer.

In order to provide exchange coupling between the anti-ferromagnetic layer and the ferromagnetic layer (pinned layer), a process of temperature annealing under an external magnetic field with a specific direction (pin anneal process) is implemented. The pin anneal process is done as follows, first the temperature is elevated up to the Neel point at which temperature magnetization order in the anti-ferromagnetic material layer will be destroyed, and then cooled down to room temperature under a certain magnetic field strength with a specific direction for the exchange coupling. By this pin anneal process, the exchange coupling is regulated at the interface of the pinned and anti-ferromagnetic layers toward the direction of the externally applied magnetic field.

Thus, to provide the exchange coupling between the anti-ferromagnetic and pinned layers, it is necessary in the conventional art to additionally execute a temperature annealing under application of magnetic field, whereby not only the manufacturing processes become complicated but also the manufacturing cost is increased.

Also, to simultaneously carry out the same magnetization process for a plurality of magnetic heads, it is necessary to uniformly align the directions of the external magnetic fields that are applied to the magnetic heads. Therefore, the temperature annealing under magnetic field is usually executed at a wafer process stage of the magnetic heads or at a bar stage where a wafer is cut into some bar-shaped blocks. This is because carrying out such pin anneal process under magnetic field after separating the bar block into the individual magnetic heads is troublesome to define the magnetization directions and becomes non-effective. However, even if the magnetic heads are in any state such as in a state where they are individually separated, it is naturally desirable that the process of providing the exchange coupling between the anti-ferromagnetic and pinned layers can be easily executed.

When some electric charges are applied to the terminals of the MR elements due to certain reason during manufacturing processes such as the wafer process of the magnetic heads and the mechanical working process, or during assembling processes of completed heads to the magnetic disk unit, the pinned direction of the spin valve MR element may be changed or inverted and thus various characteristics of the head may vary causing incorrect reproduction of the magnetically recorded signal. The change or inversion of the pinned direction may be caused by heat and magnetic field generated by the applied electric charges.

As aforementioned, if the pinned direction changes, the angle between the magnetization directions in the pinned and free layers also changes causing the output characteristics to vary. Thus, it is very important in the magnetic head with the spin valve MR element to correctly maintain or fix the pinned direction. However, when the pinned direction changes after separating the bar block into the individual magnetic heads, it is very difficult as mentioned above to provide the exchange coupling between the anti-ferromagnetic and pinned layers again and return the pinned direction to the correct direction. Therefore, such processes have not been executed in the conventional technique, and the resulting magnetic heads have been treated as failed components.

U.S. Pat. No. 5,650,887 discloses a pinned layer magnetization reset system which applies a rectangular waveform current to a spin valve MR sensor so as to heat the sensor and to generate a magnetic field around the pinned layer and thus controls the pinned direction. However, this reset system cannot execute sufficient temperature and magnetic field control during cooling stage after heating the spin valve MR element. Thus, it is difficult to return the output characteristics of the spin valve MR element back to its desired state.

SUMMARY OF THE INVENTION

It is therefore an object of the present invention to provide a method of controlling magnetic characteristics of a MR element, a method of controlling magnetic characteristics of a magnetic head with the MR element, a magnetic head device with the MR element, and a magnetic disk unit with the device, whereby control of the pinned direction in the MR element can be extremely easily executed without adding new processes even after the magnetic heads are individually separated.

It is another object of the present invention to provide a method of controlling magnetic characteristics of a MR element, a method of controlling magnetic characteristics of a magnetic head with the MR element, a magnetic head device with the MR element, and a magnetic disk unit with the device, whereby, ideal temperature control and magnetic field control can be executed during the above-mentioned control of the pinned direction in the MR element.

According to the present invention, a method of controlling magnetic characteristics of a MR element and a method of controlling magnetic characteristics of a magnetic head with the MR element utilizing exchange coupling magnetization, include a step of supplying discrete rectangular waveform currents or a rectangular waveform current to the MR element so as to generate magnetic field in a desired direction and to generate Joule heat, the generated magnetic field and the generated joule heat being applied to the MR element, and a step of controlling a duty ratio of the discrete rectangular waveform currents or a time constant of the falling of the rectangular waveform current so that a temperature of the MR element is controlled under a desired temperature change characteristics, whereby a magnetization direction caused by the exchange coupling in the MR element is aligned to a desired direction.

In the method of controlling magnetic characteristics of the present invention, the heating process and magnetization process for the exchange coupling of a MR element are simultaneously executed by controlling a duty ratio of the discrete rectangular waveform currents or by controlling a time constant of the falling of the rectangular waveform current supplied to the MR element so that a desired temperature change characteristics is obtained. Since the method of the present invention can be accomplished by only supplying the discrete rectangular waveform currents with the controlled duty ratio or the rectangular waveform current with time constant controlled falling edge to the MR element by the same manner as in the sense current, it can be extremely easily executed without adding new steps. Also, even after magnetic heads are individually separated, the control of the pinned direction in the MR element can be extremely easily and reliably executed. Consequently, the magnetic head individually separated and treated as a defective head due to change in the pinned direction can be recovered as a good article by adjusting the pinned direction to the correct direction. This control of the pinned direction can be executed even in operation of a magnetic disk unit after assembling magnetic heads in the magnetic disk unit, so that the pinned direction is always maintained in the normal state.

It is preferred that the method further includes a step of controlling an amplitude and a duration of a first one of the discrete rectangular waveform currents or the rectangular waveform current so that a temperature of the MR element is controlled at a heating temperature equal to or higher than a temperature at which magnetic order of an anti-ferromagnetic layer will disappear from a macroscopic view point (in general lower than the Neel temperature by 30–50° C.) and lower than an upper limit temperature of the MR element above which temperature the MR element will be subject to unrecoverable damage.

It is also preferred that the duty ratio controlling step or the time constant controlling step is executed after the amplitude and duration controlling step, and wherein the duty ratio controlling step includes a step of controlling the duty ratio of the discrete rectangular waveform currents or the time constant controlling step includes a step of controlling the time constant of the falling of the rectangular waveform current so that a temperature of the MR element is gradually decreased from the heating temperature.

The former method for controlling the duty ratio of the discrete rectangular waveform currents can decay the temperature with keeping the amplitude of the currents. The latter method for controlling the time constant of the falling of the rectangular waveform current can decay the temperature by gradually decreasing the amplitude of the current. Thus, according to both the methods, the magnetic field applied to the MR element can be kept at high level during the cooling stage and therefore the pinned direction can be more reliably controlled.

It is further preferred that the MR element is a spin valve MR element including a non-magnetic and electrically conductive material layer, first and second ferromagnetic material layers magnetically separated by the non-magnetic material layer and an anti-ferromagnetic material layer deposited on the second ferromagnetic material layer.

Preferably, the magnetic characteristics control is executed at least one time during a fabricating process of the magnetic head or during an evaluation process of electromagnetic conversion characteristics of the magnetic head, at least one time during an assembling process of the magnetic disk unit or during an evaluation process of electromagnetic conversion characteristics of the magnetic disk unit, or at least one time during a self-diagnosis operation of the magnetic disk unit.

According to the present invention, also, a magnetic disk unit or a magnetic head device with a MR element utilizing exchange coupling magnetization, includes a circuit for supplying discrete rectangular waveform currents or a rectangular waveform current in stead of a normal sense current to the MR element so as to generate magnetic field in a desired direction and to generate joule heat, the generated magnetic field and the generated joule heat being applied to the MR element, and a circuit for controlling a duty ratio of the discrete rectangular waveform currents or a time constant of the falling of the rectangular waveform current so that a temperature of the MR element is controlled under a desired temperature change characteristics, whereby a magnetization direction caused by the exchange coupling in the MR element is aligned to a desired direction.

It is preferred that the unit or the device further includes a circuit for controlling an amplitude and a duration of a first one of the discrete rectangular waveform currents or the rectangular waveform current so that a temperature of the MR element is controlled at a heating temperature equal to or higher than a temperature at which magnetic order of an anti-ferromagnetic layer will disappear from a macroscopic view point and lower than an upper limit temperature of the MR element.

It is also preferred that the duty ratio controlling circuit includes a circuit for controlling the duty ratio of the discrete rectangular waveform currents or the time constant controlling circuit includes a circuit for controlling the time constant of the falling of the rectangular waveform current so that a temperature of the MR element is gradually decreased from the heating temperature.

The former circuit for controlling the duty ratio of the discrete rectangular waveform currents can decay the temperature with keeping the amplitude of the currents. The latter circuit for controlling the time constant of the falling of the rectangular waveform current can decay the temperature by gradually decreasing the amplitude of the current. Thus, according to both the circuits, the magnetic field applied to the MR element can be kept at high level during the cooling stage and therefore the pinned direction can be more reliably controlled.

Preferably, the unit or the device further comprises a magnetic head with the MR element, a first head IC chip for controlling the magnetic head, a second head IC chip for controlling the first head IC chip and a suspension for supporting the magnetic head and the first head IC chip, and wherein the supplying circuit and the controlling circuit are formed in the second head IC chip.

Also, preferably, the MR element is a spin valve MR element including a non-magnetic and electrically conductive material layer, first and second ferromagnetic material layers magnetically separated by the non-magnetic material layer and an anti-ferromagnetic material layer deposited on the second ferromagnetic material layer.

Further objects and advantages of the present invention will be apparent from description of the preferred embodiments of the invention as illustrated in accompanying drawings.

BRIEF DESCRIPTION OF THE DRAWINGS

FIG. 7, constituted by combining FIGS. 7A to 7C, shows a flow chart illustrating when the pinned direction control according to the present invention is actually executed;

DESCRIPTION OF THE PREFERRED EMBODIMENTS

Before describing the embodiments of the present invention, basic principle of the present invention will be explained.

Figure 1:
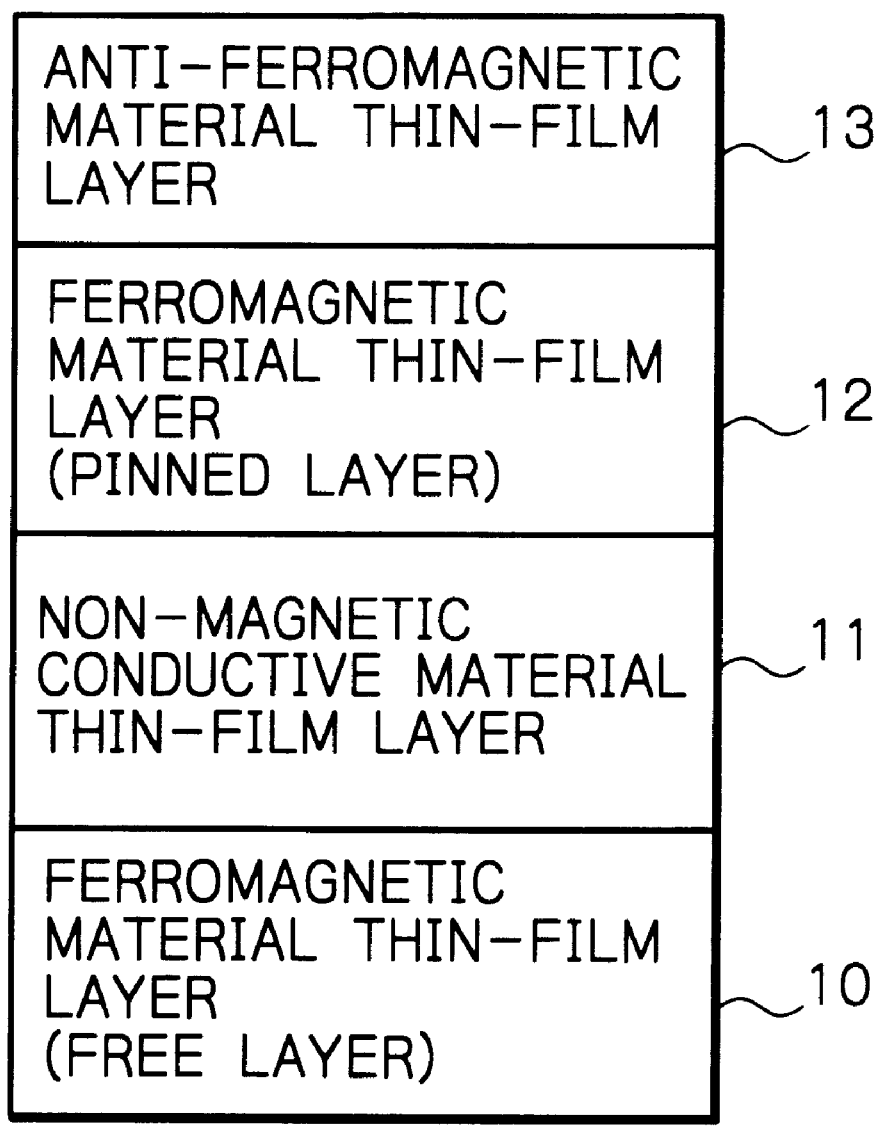
FIG. 1 shows a cross-sectional view illustrating a basic configuration of a multi-layered spin valve structure.

In FIG. 1 illustrating a multi-layered spin valve structure, reference numerals 10 and 12 are two ferromagnetic material thin-film layers. The multi-layered spin valve structure has a sandwiched structure with the two layers 10 and 12 magnetically separated with each other by a non-magnetic and electrically conductive material thin-film layer 11. On the layer 12 is deposited an anti-ferromagnetic material thin-film layer 13. Exchange bias magnetic field generated at the interface between the ferromagnetic layer 12 and the anti-ferromagnetic layer 13 is applied to the ferromagnetic layer (a pinned layer) 12 to pin the layer 12. The layer 10 is a free layer to which no exchange biasing magnetic field is applied.

Figure 2A:
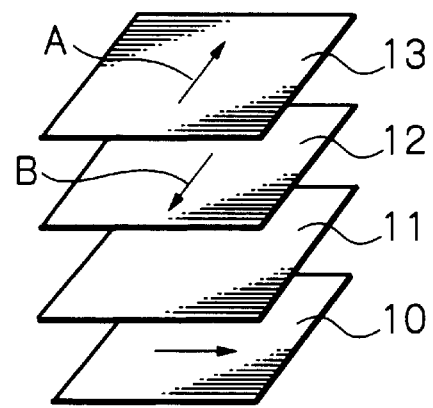
FIGS. 2a to 2d illustrate the control principle of the pinned direction of the multi-layered spin valve structure.
Figure 2B:
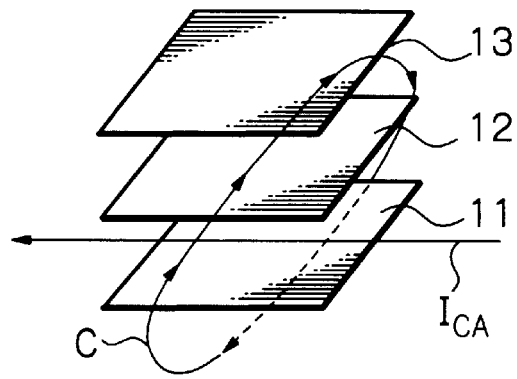
Figure 2C:
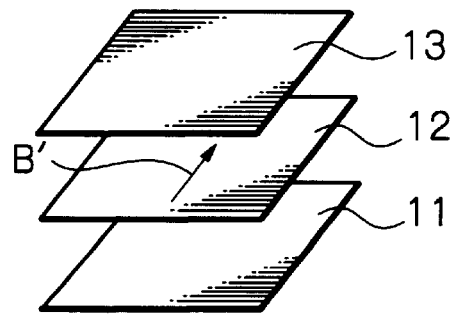
Figure 2D:
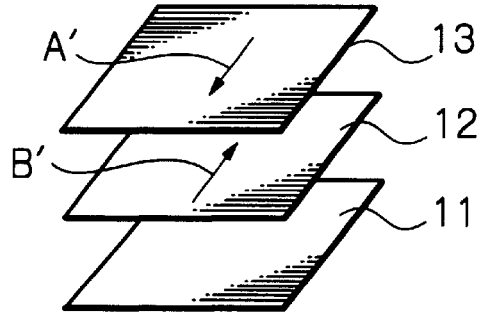

FIGS. 2a to 2d illustrate the control principle of the pinned direction of the multi-layered spin valve structure. As shown in FIG. 2a, it is supposed that the anti-ferromagnetic layer 13 has an erroneous anisotropic direction, shown by an arrow A, due to a certain reason. Thus, a pinned direction of the ferromagnetic layer 12 has an erroneous pinned direction shown by an arrow B. According to the present invention, a control current in discrete rectangular waveform $I_{CA}$ is supplied to flow through the spin valve structure in a direction shown in FIG. 2b to generate heat in the spin valve structure due to joule effect caused by the supplied current. When temperature of the anti-ferromagnetic layer 13 increases above a certain temperature which will be in general lower than the Neel temperature by 30–50° C., its magnetic order disappears. Thus, a non-pinned ferromagnetic layer 12 is easily magnetized by magnetic field C generated by the control current $I_{CA}$ in a direction B' shown in FIG. 2c. Adjusting the direction of this current flow can freely control this magnetization direction of the ferromagnetic layer 12. When the temperature of the anti-ferromagnetic layer 13 decreases lower than the above-mentioned magnetic order disappearing temperature by controlling a duty ratio or a time constant at falling edge of the current $I_{CA}$, anisotropy is generated in the direction A' depending upon the magnetization direction (an arrow B') of the ferromagnetic layer 12 or upon the direction of applied magnetic field due to the current $I_{CA}$, in this anti-ferromagnetic layer 13, as shown in FIG. 2d. When the magnetic order in the anti-ferromagnetic layer 13 is recovered, the ferromagnetic layer 12 is pinned in the direction B'.

Figure 3:
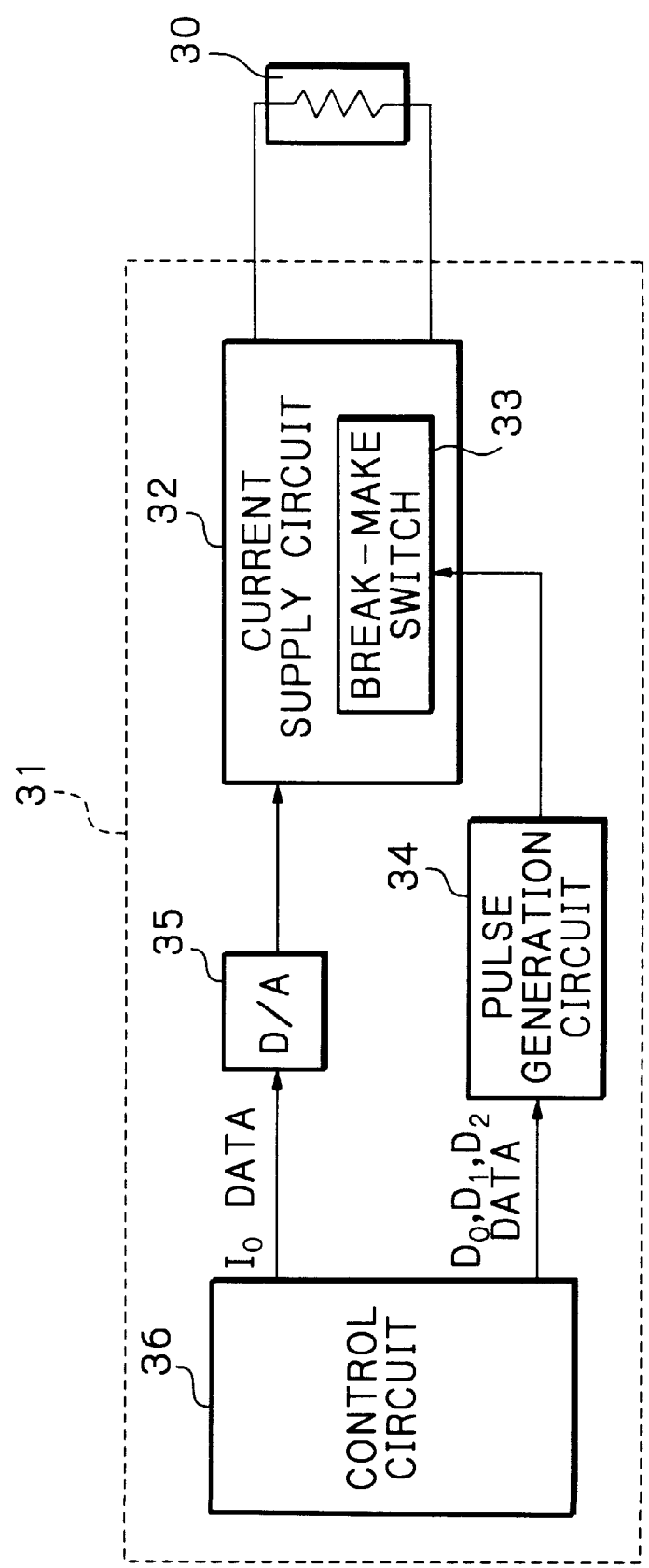
FIG. 3 shows a block diagram schematically illustrating a configuration of a magnetic characteristics control circuit in a preferred embodiment according to the present invention.

FIG. 3 schematically illustrates a magnetic characteristics control circuit in a preferred embodiment according to the present invention. In this embodiment, the magnetic characteristics control circuit is mounted in an evaluation device for evaluating electromagnetic conversion characteristics of the thin-film magnetic head.

The magnetic characteristics of a spin valve MR element is controlled during an evaluation process of electromagnetic conversion characteristics, which will be executed after output electrode terminals connected to the spin valve MR element are formed in a wafer process and before a suspension head assembly with the MR element mounted in a magnetic disk unit or a hard disk drive (HDD) unit is actually operated.

The pinned direction of the spin valve MR element has possibility to change a little due to damage subjected during manufacturing processes of magnetic heads or subsequent manufacturing process of magnetic disk units. Because of too small change, it is difficult to detect it by the following evaluation process of electromagnetic conversion characteristics or the evaluation process of ρ-H characteristics with respect to the magnetic head. This causes to the MR element to have deteriorated characteristics compared to those in the inherent desired state.

Whereas, in this embodiment, the magnetic characteristics control circuit is mounted in the evaluation device connected with terminal electrodes of each of the magnetic heads for supplying control currents to the MR element so as to produce magnetic field in the same direction as the inherent pinned direction. Thus, the pinned direction is recovered to the inherent desired direction by heat and magnetic field generated by the supplied control current.

In FIG. 3, reference numeral 30 denotes a spin valve MR element in the thin-film magnetic head, and 31 denotes the magnetic characteristics control circuit connected across terminal electrodes of this MR element 30, respectively. The circuit 31 includes a current supply circuit 32 connected to the MR element 30, a break-make switch 33 for on/off controlling a constant current generated in the current supply circuit 32 to produce the control currents, a pulse generation circuit 34 for generating pulses with instructed duty ratios and for applying the generated pulses to the brake-make switch 33, a D/A converter 35, and a control circuit 36 constituted by a microcomputer.

The control circuit 36 provides data indicating a peak level (amplitude) $I_0$ of the control current to be outputted from the current supply circuit 32, data indicating duration of time $D_0$ of the rectangular waveform of the control current during a heating stage, and data indicating duration of time $D_2$ and quiescent period of time $D_1$ of the control currents during a cooling stage after the heating stage.

The $I_0$ data of the peak level (amplitude) is converted into an analogue signal at the D/A converter 35 and then applied to the current supply circuit 32 to set the peak level of its output current to the value of the $I_0$ data. The $D_0$ data of duration, the $D_2$ data of duration and the $D_1$ data of quiescent period are applied to the pulse generation circuit 34 to generate a pulse with a duration corresponding to the $D_0$ data, and a plurality of pulses with a duration corresponding to the $D_2$ data and with a quiescent period corresponding to the $D_1$ data. These generated pulses are applied to the break-make switch 33 to produce the control currents having durations and a quiescent period equal to these of the applied pulses. The produced discrete control currents are outputted from the current supply circuit 32 and applied to the MR element 30. The direction of flow of the control currents in the spin valve MR element 30 is of course set to that whereby produced are magnetic fields for controlling magnetization direction in the pinned layer toward the desired pinned direction.

When it is intended to execute no magnetic characteristics control and to apply normal sense current to the MR element 30, the control circuit 36 provides data indicating amplitude level and applying period of the sense current and thus the current supply circuit 32 outputs a continuous constant sense current to the MR element 30.

Figure 4A:
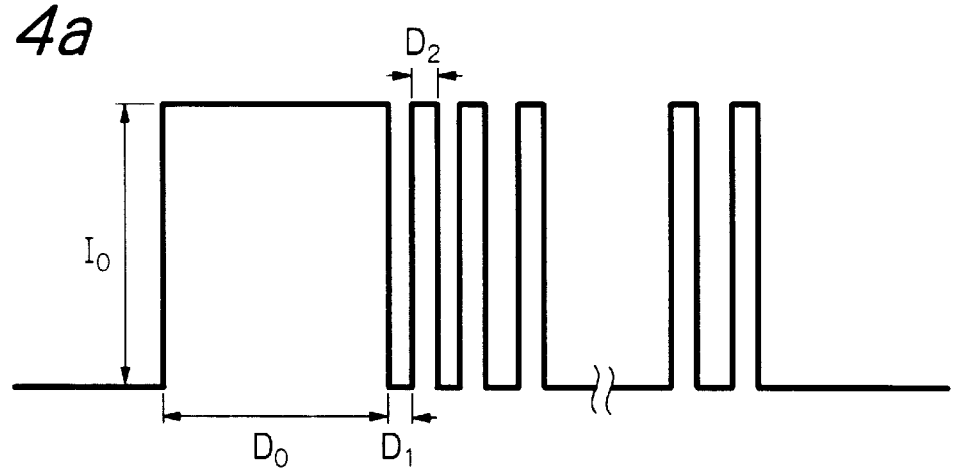
FIGS. 4a to 4c illustrate examples of current waveform applied to a spin valve MR element and temperature characteristics of the MR element in the embodiment shown in FIG. 3 and in its modification.
Figure 4B:
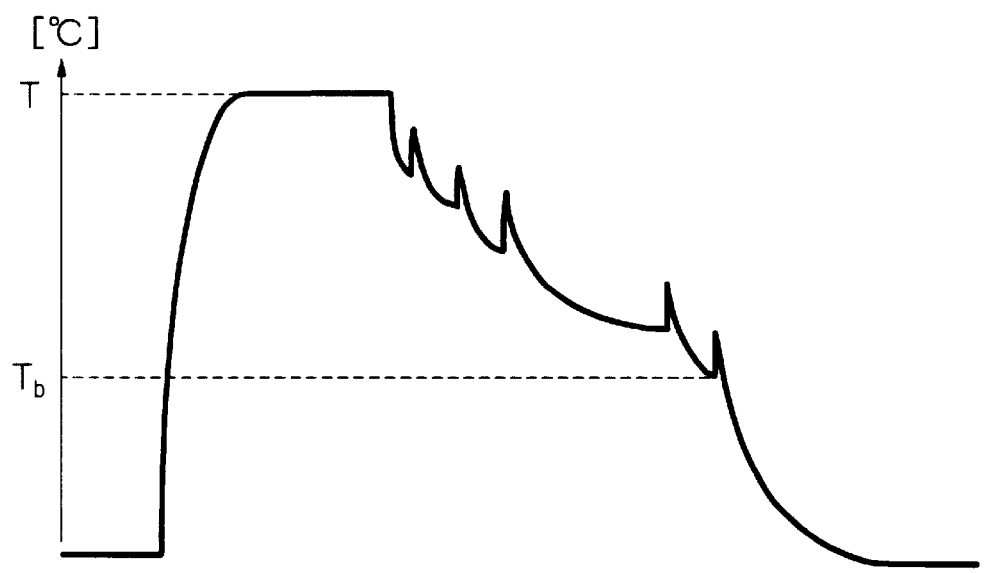

When it is intended to execute the magnetic characteristics control, the control circuit 36 first provides the $I_0$ data of the peak level of the control current and the $D_0$ data of the duration of the control current. Thus, as shown in FIG. 4a, the control current with the rectangular waveform having the peak level of $I_0$ and the duration of $D_0$ is applied to the spin valve MR element 30 as the heating stage. Thus, as shown in FIG. 4b, the temperature of the MR element 30 increases to a temperature T equal to or higher than a certain temperature $T_b$ at which magnetic order of the anti-ferromagnetic layer 13 (FIG. 1) will disappear from a macroscopic view point. The temperature $T_b$ will be in general lower than the Neel temperature by 30–50° C. The pinned layer 12 (FIG. 1) is simultaneously magnetized by the magnetic field produced by this control current. The magnetization direction can be controlled depending upon the flowing direction of the control current.

During this heating stage, the temperature of the MR element 30 is controlled at a value equal to or higher than the temperature $T_b$ at which magnetic order of the anti-ferromagnetic layer 13 will disappear from a macroscopic view point and lower than the upper limit temperature $T_p$ of the MR element 30 at and above which temperature the MR element will be subject to unrecoverable damage.

Figure 5:
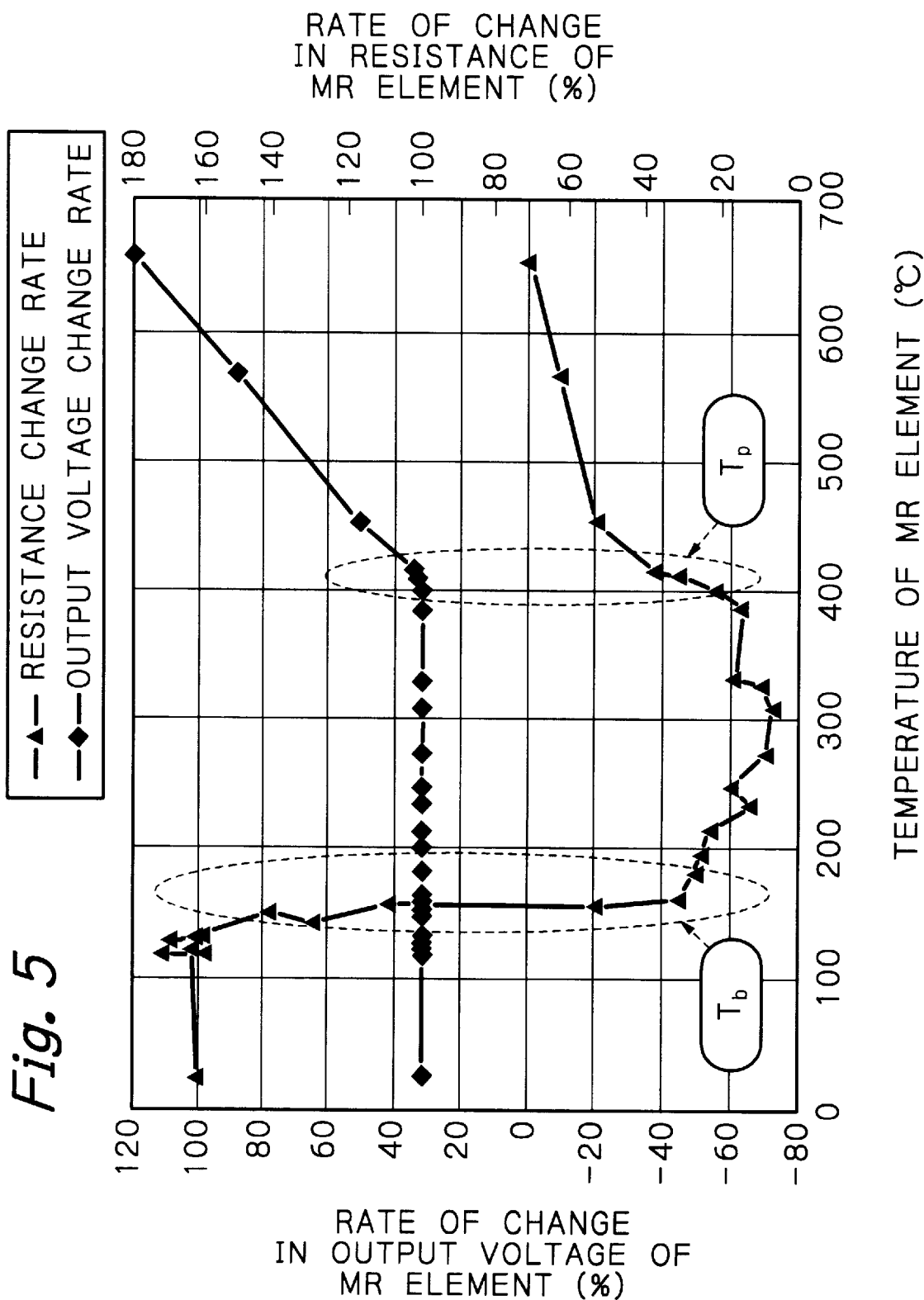
FIG. 5 illustrates rate of change in output voltage and rate of change in resistance of a spin valve MR element versus its temperature.

FIG. 5 illustrates rate of change in output voltage and rate of change in resistance of the spin valve MR element versus its temperature. The horizontal axis in the figure represents the temperature of the MR element (° C.), the vertical axis represents the rate of change in the output voltage from the MR element (%) and also the rate of change in the resistance of the MR element (%). Negative values in the output voltage change rate indicate that the magnetization direction of the pinned layer 12 (FIG. 1) is inverted from its initial correct pinned direction.

When the energy injected into the MR element increases, first at a temperature $T_b$ near 170° C., the magnetization direction in the pinned layer 12 is inverted causing the resistance change rate of the MR element to vary by a large amount. Then, at a temperature $T_p$ near 400° C., the resistance of the MR element changes causing the output voltage of the MR element to reduce depending upon the amount of change of the resistance.

As aforementioned, at and above the upper limit temperature $T_p$, the MR element will be subject to unrecoverable damage due to the injected energy. Whereas, at a temperature equal to or higher than the temperature $T_b$ but lower than the temperature $T_p$, the pinned direction is reversible. The temperature $T_b$ at which magnetic order of the anti-ferromagnetic layer will disappear from a macroscopic viewpoint may differ depending upon materials of the anti-ferromagnetic layer 13. However, the behavior shown in FIG. 5 substantially is common in all spin valve MR elements. Therefore, the temperature T during the heating stage is kept within a range of $T_b \leq T < T_p$.

After the heating stage, the cooling stage is executed. In this cooling stage, the control circuit 36 provides the $I_0$ data of the peak level of the control currents, the $D_2$ data of the duration and the $D_1$ data of the quiescent period of the control currents. Thus, as shown in FIG. 4a, the control currents formed by discrete rectangular waveform currents with a duty ratio of $D_2/D_1$ having the peak level of $I_0$ is applied to the spin valve MR element 30. By changing (decreasing) the duty ratio, the temperature of the MR element 30 gradually decreases, as shown in FIG. 4b, to a temperature such as a room temperature, which is lower than the temperature $T_b$ at which magnetic order of the anti-ferromagnetic layer 13 will disappear from a macroscopic view point. During this cooling stage, since the discrete rectangular waveform currents are flowing through the MR element, the anti-ferromagnetic layer 13 has anisotropy in the same direction as that of the magnetic field produced by the pulse currents. Also, since all the discrete rectangular waveform currents have the large peak level of $I_0$, the produced and applied magnetic field is strong. Thus, reliable pinned direction control can be easily realized.

The temperature-reduction characteristics and the magnetic field applied during the temperature-reduction stage are very important. In the aforementioned embodiment, during the cooling stage, the magnetic field is applied by supplying the discrete rectangular waveform currents and optimum temperature-reduction characteristics is realized by controlling the duty ratio $D_2/D_1$ of the pulse currents. Also, during the heating stage, the element temperature T is kept within the range of $T_b \leq T < T_p$ by controlling the peak level (amplitude) $I_0$ and the duration $D_0$ of the rectangular waveform current applied to the MR element resulting that its pinned layer is under the controllable state.

In fact, if a spin valve MR element has an element resistance of $R_{RT}=50.6$ Ω at room temperature (23° C.), the peak level (amplitude) $I_0$ of the rectangular waveform current to be applied to this MR element is desired within the range of about 18 mA$\leq I_0 \leq$about 44 mA. This range is experimentally determined as follows.

It has been found from many experiments that there is a relationship of $R/R_{RT}=0.0017452T+0.9593808$ between the resistance value R (Ω) of the spin valve MR element heated to a temperature T (° C.) and this temperature T. Therefore, the temperature T is expressed as $T=(R/R_{RT}-0.9593808)/0.0017452$.

On the other hands, the element resistance R and the applied energy $I_0^2 R D_0$ are experimentally obtained as $R=62.7$ Ω and $I_0^2 R D_0=0.33$ nJ when a current with $D_0=20$ nsec and $I_0=18.1$ mA is applied to the MR element, and $R=84.0$ Ω and $I_0^2 R D_0=1.96$ nJ when a current with $D_0=20$ nsec and $I_0=44.0$ mA is applied to the MR element. The element temperatures T at $I_0=18.1$ mA and $I_0=44.0$ mA are obtained by substituting these element resistances into the above equation as T=180.7° C. at $I_0=18.1$ mA and T=400.0° C. at $I_0=44.0$ mA.

Thus, it is confirmed that, from the range of the appropriate temperature shown in FIG. 5, the peak level $I_0$ of the applying current should be selected as about 18 mA≦$I_0$≦about 44 mA. As is well known the sense current normally applied to the MR element is a continuous current of about 5 mA, which is greatly smaller than the above-mentioned peak level $I_0$.

It is desired that the duration $D_0$, the duration $D_2$ and the quiescent period $D_1$ are selected as $D_0$≧about 20 nsec, $D_2$<about 20 nsec, and $D_1$<about 20 nsec. These values are experimentally obtained as follows.

Figure 6:
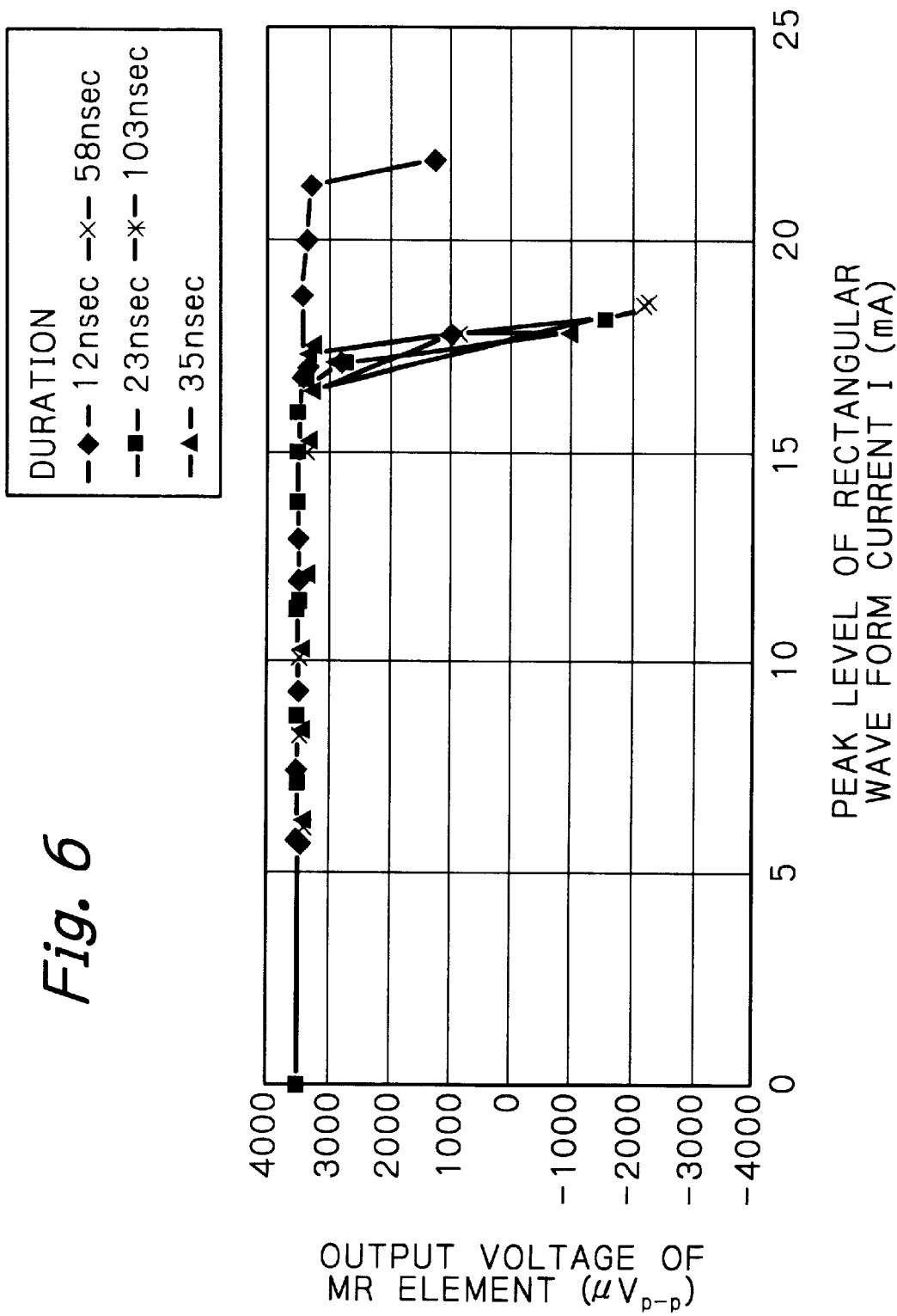
FIG. 6 illustrates output voltage of the spin valve MR element versus peak level of rectangular waveform current applied to the MR element, represented by using a parameter with respect to duration of time of the rectangular waveform current.

FIG. 6 illustrates output voltage of the spin valve MR element versus peak level I of the rectangular waveform current applied to the MR element. The output voltages are represented for different durations D of the rectangular waveform current, namely D=12 nsec, 23 nsec, 35 nsec, 58 nsec and 103 nsec. Negative values in the output voltage indicate that the element temperature raises near the temperature $T_b$ at which magnetic order of the anti-ferromagnetic layer 13 will disappear from a macroscopic view point and thus the magnetization direction of the pinned layer 12 is inverted from its initial correct pinned direction.

As will be noted from the figure, if the duration D of the rectangular waveform current is D=23 nsec or more, the pinned directions are inverted at the peak level of $I_0$=about 17.5 mA. In other words, if the duration is D=23 nsec or more, the element temperature raises near the temperature $T_b$ at which magnetic order of the anti-ferromagnetic layer disappears from a macroscopic viewpoint. Thus, it is revealed that a thermal transmission delay which represent a time delay from the application of the current to actual raising of the element temperature is about 20 nsec. Therefore, it is required that the duration $D_0$ of the rectangular waveform applied to the MR element during the heating stage is equal to or longer than about 20 nsec. Also, it is required that both of the duration $D_2$ and the quiescent period $D_1$ of the discrete rectangular waveform currents applied to the MR element during the cooling stage are shorter than about 20 nsec, respectively.

In the embodiment described above, the control of the pinned direction is executed during the evaluation process of electromagnetic conversion characteristics in the magnetic head. However, it is apparent to a person skilled in the art that the pinned direction control may be executed during an evaluation process of ρ-H characteristics of a spin valve MR element.

As described above, the control of the pinned direction according to this embodiment is executed during the evaluation process of the electromagnetic conversion characteristics, which process will be executed after the output electrode terminals connected to spin valve MR elements are formed in the wafer process and before head suspension assemblies with the spin valve MR elements are mounted in a magnetic disk unit (HDD) and actually operated. However, the control operation of magnetic characteristics (pinned direction) of the present invention and an evaluation process of electromagnetic conversion characteristics (or ρ-H characteristics) may be individually executed. Namely, if necessary, the control of magnetic characteristics may be executed at any time.

Figure 7C:
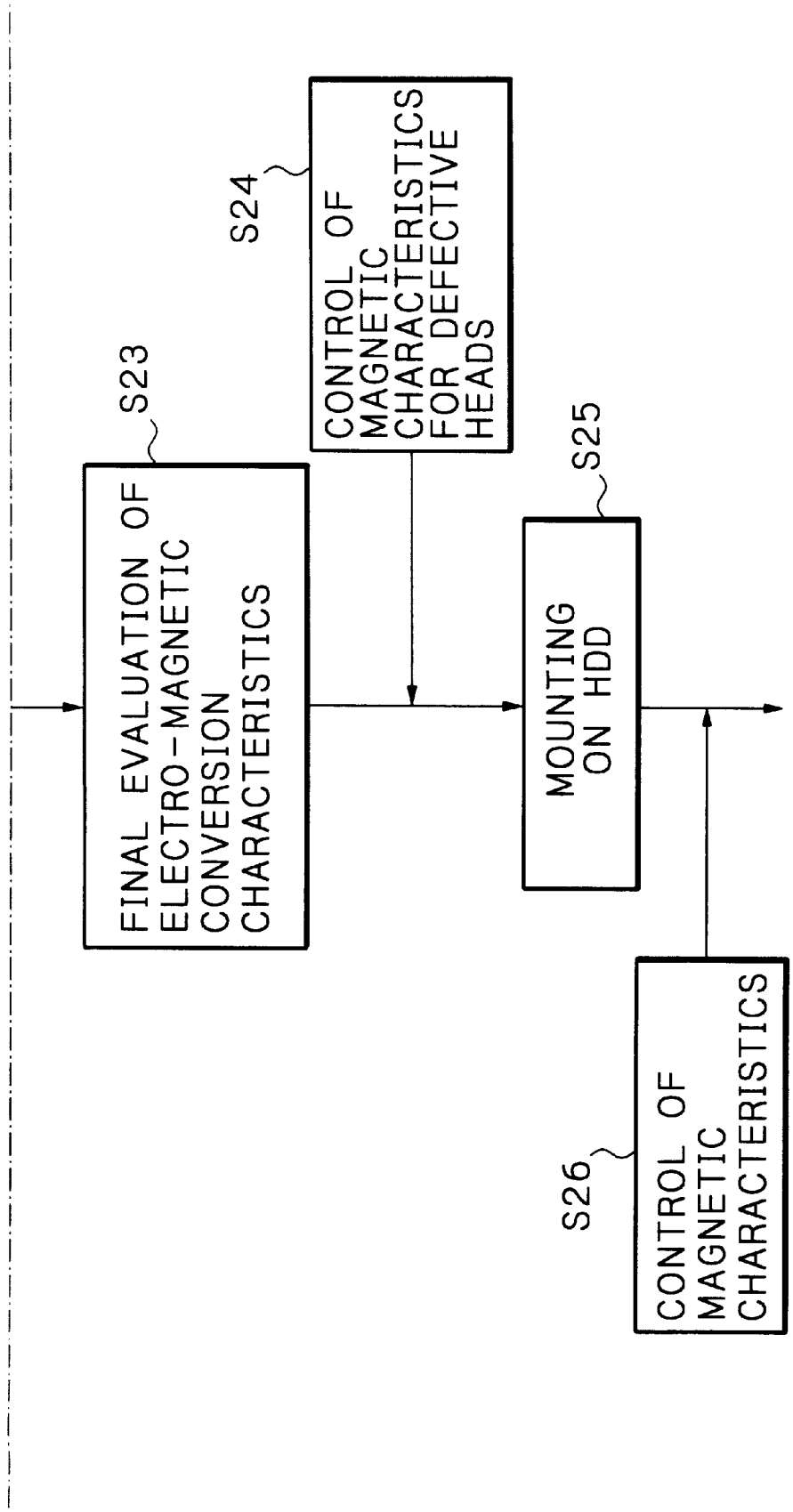

FIG. 7 illustrates timing when the pinned direction control according to the present invention is actually executed. Step 10 in this figure represents a wafer process in which a number of magnetic heads are fabricated on a substrate by an integration technology. After this wafer process has completed, control of the pinned direction according to the present invention is executed at step Sll in place of heat treatment process in magnetic field for controlling magnetic characteristics, which has been conventionally executed. Consequently, a very easier process than the conventional heat treatment process can execute the control of the pinned direction. Alternately, if an evaluation process of electromagnetic conversion characteristics or ρ-H characteristics is executed after the wafer process S10 is completed, control of the pinned direction may be executed during this evaluation process, as shown by step S12. In the evaluation process of electromagnetic characteristics or ρ-H characteristics, electrode terminals of each magnetic head are electrically connected to the evaluation unit. Accordingly, the control of the pinned direction accomplished by only supplying currents to the MR element can be very easily executed.

Next step S13, step S14, step S15 and step S16 represent a cutting process of the wafer into bars so that a magnetic head is aligned, a polishing process for adjusting such as a throat height, a film forming process of a DLC (diamond-like carbon) film, and a rail forming process, respectively.

In place of conventional heat treatment in magnetic field process for controlling magnetic characteristics, the control of pinned direction according to the present invention may be executed at step S17 after the rail forming process at step S16. This control of pinned direction may be executed during evaluation process of electromagnetic conversion characteristics or ρ-H characteristics at step S18. If the control of magnetic characteristics is executed at step S11 or step S12, the control of magnetic characteristics is not executed at steps S17 and S18.

Next step S19 is a cutting process for separating each bar into individual pieces of magnetic head sliders. After the cutting process at step S19, control of pinned direction may be executed during an evaluation process of electromagnetic characteristics or ρ-H characteristics at step S20. Next step S21 is an assembling process of head suspension assembly or head gimbal assembly (HGA) in which each of the magnetic head sliders is assembled with a suspension. After this head suspension or HGA assembling process at step S21, control of the pinned direction may be executed during an evaluation process of electromagnetic conversion characteristics or ρ-H characteristics at step S22.

Next step S23 is a final evaluation process of electromagnetic conversion characteristics or ρ-H characteristics of the head suspension assembly. If the magnetic head assembly is evaluated as defective one due to variation of the pinned direction in the process at step S23, the control process of pinned direction at step S24 according to the present invention is executed. In the control process at step S24, rectangular waveform current and discrete rectangular waveform currents are supplied so that magnetic field is applied to the MR element in the same direction as inherent pinned direction and the MR element is heated due to the supplied currents resulting to recover the inherent pinned direction.

At next step S25, thus produced head suspension assembly is mounted in the magnetic disk unit or HDD. After the mounting process at step S25, control process of the pinned direction at step 26 according to the present invention may be executed, if necessary. Similar to the process at step S24, in this process at step S26, rectangular waveform current and discrete rectangular waveform currents are supplied so that magnetic field is applied to the MR element in the same direction as inherent pinned direction and the MR element is heated due to the supplied currents resulting to recover the inherent pinned direction. It should be noted that it is not necessary to execute the pinned direction control at all points described above but it is necessary to execute the pinned direction control at least one point. The later execution of the pinned direction control after the manufacturing process or assembling process, the better probability of maintaining the pinned direction to a correct direction.

Figure 8:
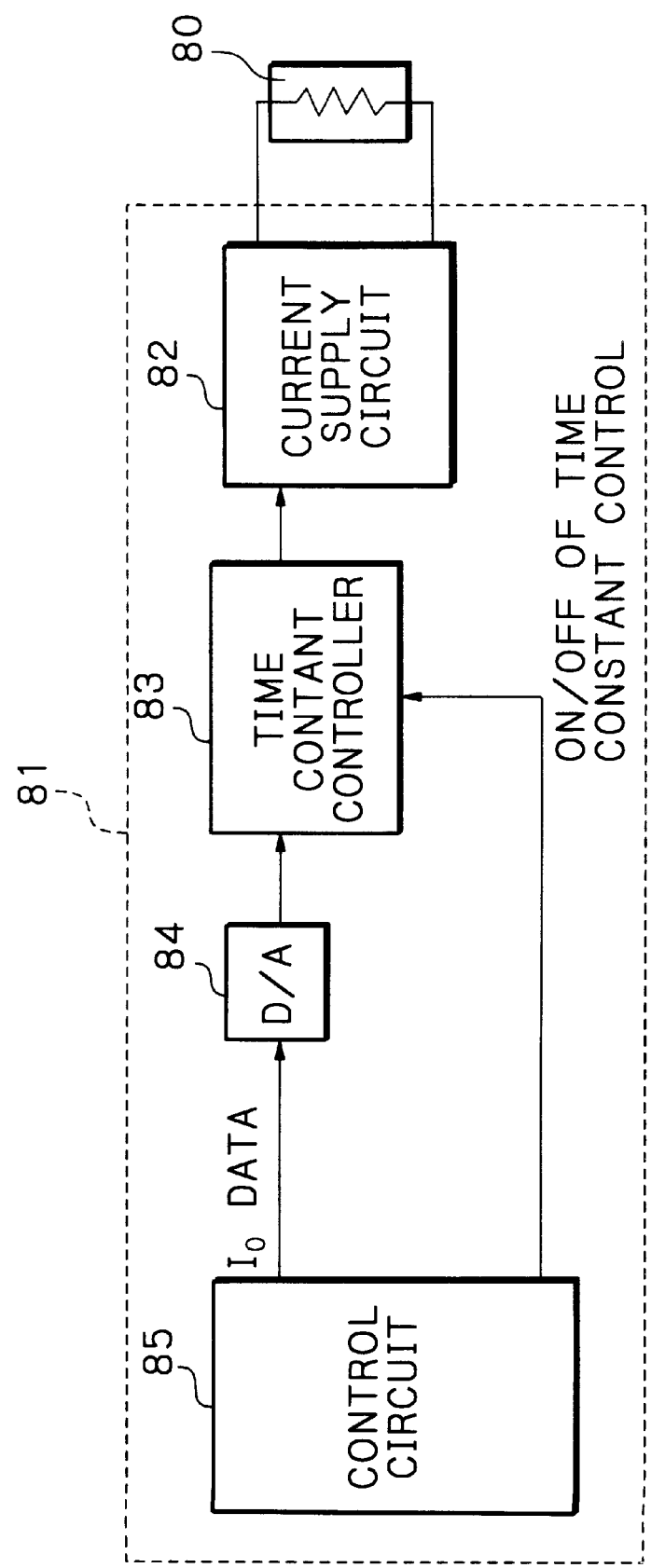
FIG. 8 shows a block diagram schematically illustrating a configuration of a magnetic characteristics control circuit in a modification of the embodiment shown in FIG. 3.

FIG. 8 schematically illustrates a modification of the magnetic characteristics control circuit in the embodiment shown in FIG. 3. This magnetic characteristics control circuit is also mounted in an evaluation device for evaluating electromagnetic conversion characteristics of the thin-film magnetic head.

In FIG. 8, reference numeral 80 denotes a spin valve MR element in the thin-film magnetic head, and 81 denotes the magnetic characteristics control circuit connected across terminal electrodes of this MR element 80, respectively. The circuit 81 includes a current supply circuit 82 connected to the MR element 80, a time constant controller 83 for controlling a time constant of falling edge of a rectangular waveform current provided from the current supply circuit 82, a D/A converter 84, and a control circuit 85 constituted by a microcomputer.

The control circuit 85 provides data indicating a peak level (amplitude) $I_0$ of a rectangular waveform current outputted from the current supply circuit 82, and an instruction signal indicating whether the time constant control is executed or not.

When it is intended to execute no magnetic characteristics control and to apply normal sense current to the MR element 80, the control circuit 85 provides the instruction signal indicating that no time constant control is to be executed and data indicating amplitude level and applying period of the sense current and thus the current supply circuit 82 outputs a continuous constant sense current to the MR element 80.

When it is intended to execute the magnetic characteristics control, the control circuit 85 provides the instruction signal indicating that the time constant control is to be executed and the $I_0$ data of the peak level of the rectangular waveform current. The duration $D_0$ of the rectangular waveform current is preliminarily determined.

Figure 4C:
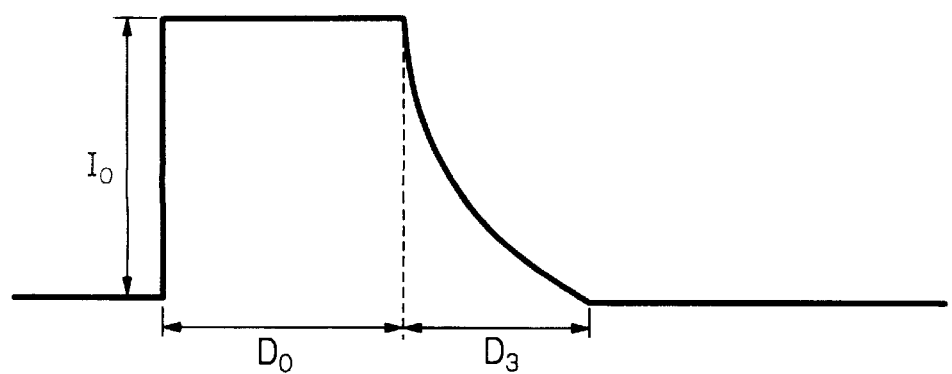

The $I_0$ data of the peak level (amplitude) is converted into an analogue signal at the D/A converter 84 and then applied to the current supply circuit 82 to set the peak level of its output current to the value of the $I_0$ data. The direction of flow of the rectangular waveform current in the spin valve MR element 80 is of course set to that whereby produced are magnetic fields for controlling magnetization direction in the pinned layer toward the desired pinned direction. Thus, as shown in FIG. 4c, a current with the rectangular waveform having the peak level of $I_0$ and the duration of $D_0$ is applied to the spin valve MR element 80 as the heating stage. Thus, as shown in FIG. 4b, the temperature of the MR element 80 increases to a temperature T equal to or higher than a certain temperature $T_b$ at which magnetic order of the anti-ferromagnetic layer 13 (FIG. 1) will disappear from a macroscopic view point. The temperature $T_b$ will be in general lower than the Neel temperature by 30–50° C. The pinned layer 12 (FIG. 1) is simultaneously magnetized by the magnetic field produced by this current. The magnetization direction can be controlled depending upon the flowing direction of the control current.

During this heating stage, the temperature of the MR element 80 is controlled at a value equal to or higher than the temperature $T_b$ at which magnetic order of the anti-ferromagnetic layer 13 will disappear from a macroscopic view point and lower than the upper limit temperature $T_p$ of the MR element 80 at and above which temperature the MR element will be subject to unrecoverable damage. Namely, as well as that in the embodiment of FIG. 3, the temperature T during the heating stage is kept within a range of $T_b \leq T < T_p$.

After the heating stage, the cooling stage is executed. In this cooling stage, the current applied to the MR element falls to zero with a predetermined time constant for a transition period $D_3$, as shown in FIG. 4c. Thus, the temperature of the MR element 80 gradually decreases, as shown in FIG. 4b, to a temperature such as a room temperature, which is lower than the temperature $T_b$ at which magnetic order of the anti-ferromagnetic layer 13 will disappear from a macroscopic view point. During this cooling stage, since the falling current is flowing through the MR element, the anti-ferromagnetic layer 13 has anisotropy in the same direction as that of the magnetic field produced by the current. Also, since the current has amplitude that gradually falls from the large peak level of $I_0$, the produced and applied magnetic field is strong at first. Thus, reliable pinned direction control can be easily realized.

The temperature-reduction characteristics and the magnetic field applied during the temperature-reduction stage are very important. In this modification, during the cooling stage, the magnetic field is applied by supplying the gradually falling current with the predetermined time constant and optimum temperature-reduction characteristics is realized by controlling the time constant. Also, during the heating stage, the element temperature T is kept within the range of $T_b \leq T < T_p$ by controlling the peak level (amplitude) $I_0$ of the rectangular waveform current applied to the MR element resulting that its pinned layer is under the controllable state.

Another configurations and advantages as well as timing when the pinned direction control are the same as those are in the embodiment shown in FIG. 3.

Figure 9:
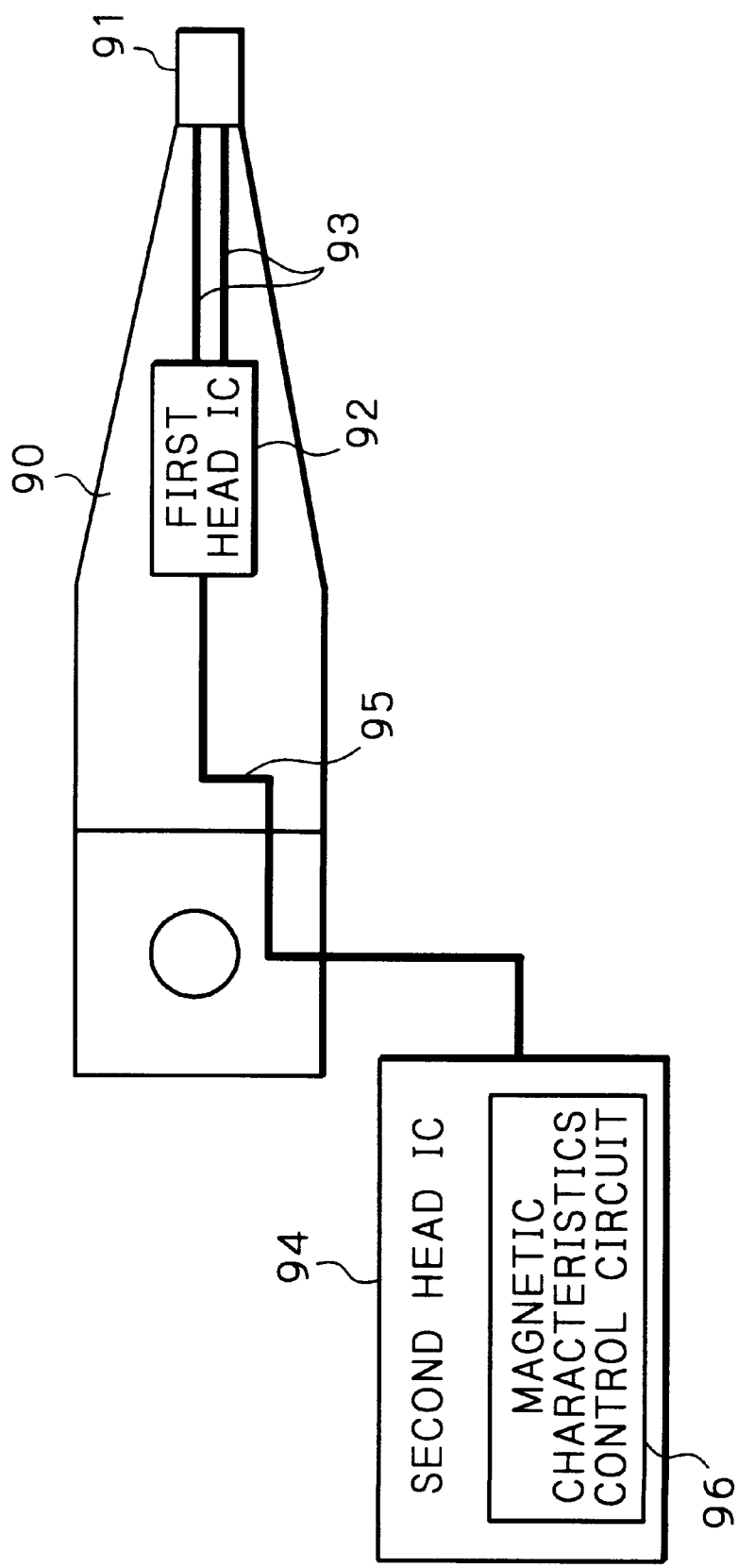
FIG. 9 illustrates arrangement of IC chips in a magnetic head device in another embodiment according to the present invention.

FIG. 9 illustrates arrangement of IC chips in a magnetic head device in another embodiment according to the present invention.

In the figure, reference numeral 90 denotes a suspension of a head suspension assembly, 91 denotes a composite type magnetic head slider attached at a top end section of the suspension 90 and provided with a spin valve MR read element and with an inductive write element, 92 denotes a first head IC chip mounted on a middle location of the suspension 90 and connected with the MR read element and the inductive write element via lead conductors 93, and 94 denotes a second head IC chip connected with the first head IC chip 92 via lead lines 95 formed by for example FPC, respectively.

The first and second head IC chips 92 and 94 have write driver functions for applying a write current with polarities varying in accordance with write data to the inductive element, and read preamplifier functions for amplifying read-out data voltage from the MR element and for outputting the amplified voltage. The first head IC chip 92 mainly operates as a final stage of the write driver functions and a first stage of the read preamplifier functions. The second head IC chip 94 mainly operates as an amplifier stage next to the final driver stage and to the first preamplifier stage.

In this embodiment, a magnetic characteristics control circuit 96 is mounted in the second head IC chip 94. The configurations of these magnetic characteristics control circuit 96 is the same as that of the magnetic characteristics control circuit 31 shown in FIG. 3 or the magnetic characteristics control circuit 81 shown in FIG. 8. The pinned direction control is executed in this embodiment after the second head IC chip 94 is mounted on the suspension 90.

Another configurations and advantages as well as timing when the pinned direction control are the same as those are in the embodiment shown in FIG. 3 or in the modification shown in FIG. 8.

Figure 10:
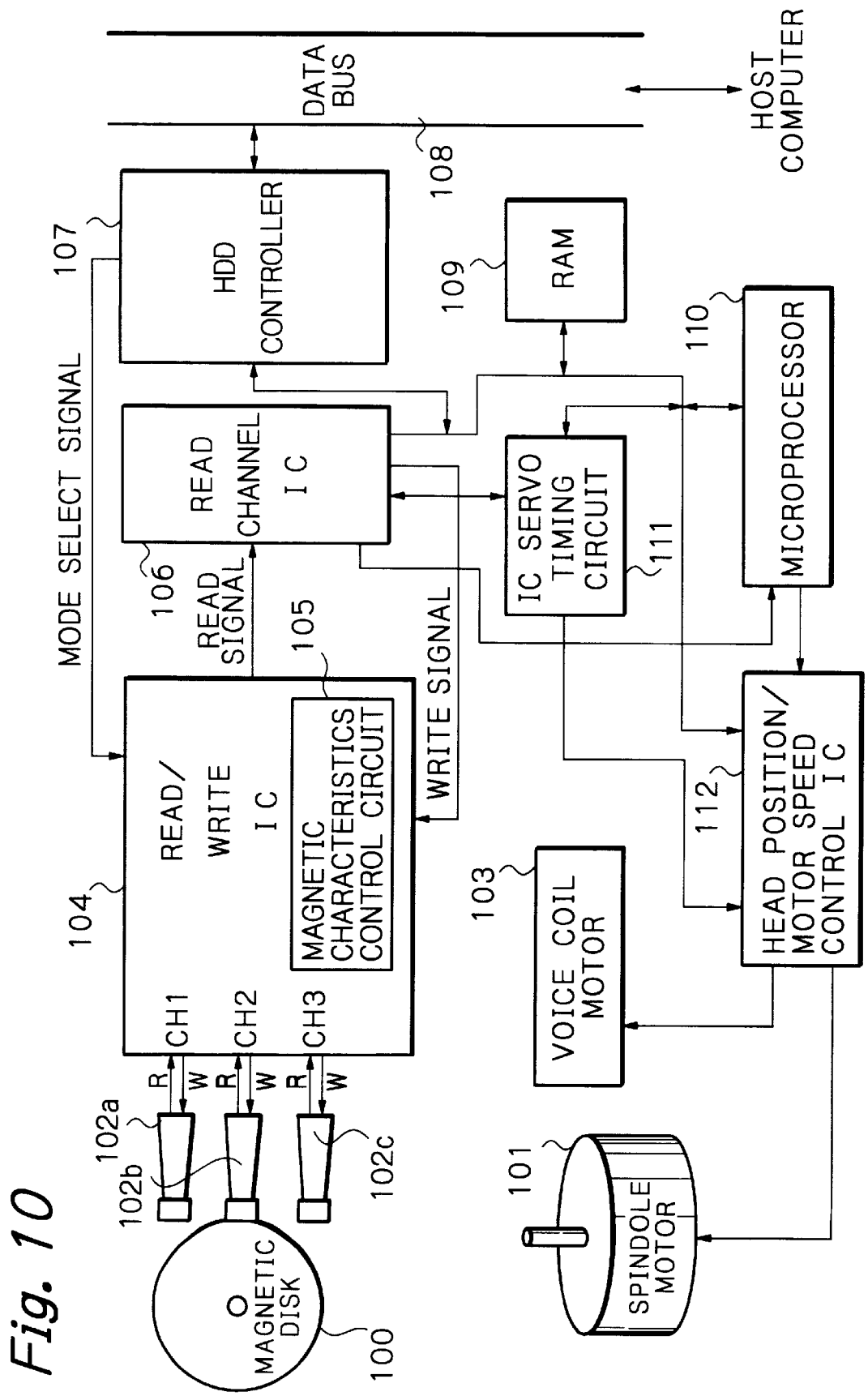
FIG. 10 shows a block diagram schematically illustrating a configuration of a magnetic disk unit in a further embodiment according to the present invention.

FIG. 10 schematically illustrates a configuration of a magnetic disk unit in a further embodiment according to the present invention. In this embodiment, the magnetic characteristics (pinned direction) control of each head suspension assembly is periodically executed during operations of the magnetic disk unit or the HDD after the assembly is mounted in the HDD. There is a possibility of change in the pinned direction of spin valve MR elements due to some damages even during the operations of the HDD in which head suspension assemblies are mounted causing magnetic characteristics of the MR elements to deteriorate from their inherent conditions. Therefore, in this embodiment, a process of supplying discrete rectangular waveform currents or a rectangular waveform current having a gradually falling edge with a predetermined time constant is executed during a self-diagnosis operation at each power-on of the HDD, at each power-off of the HDD or at another timing, so that magnetic field is applied to the MR element in the same direction as inherent pinned direction and also the MR element is heated due to the supplied current resulting to recover the inherent pinned direction.

In FIG. 10, reference numeral 100 denotes a magnetic disk and 101 denotes a spindle motor for driving the magnetic disk 100, respectively. Reference numerals 102a, 102b and 102c denote mounted head suspension assemblies, and 103 denotes a voice coil motor for driving a driving arm to which these head suspension assemblies 102a, 102b and 102c are attached, respectively. Each of the head suspension assemblies 102a, 102b and 102c is electrically connected to each channel of a read/write IC 104. In this embodiment, a magnetic characteristics control circuit 105 is mounted in the read/write IC 104.

In FIG. 10, furthermore, reference numeral 106 denotes a read channel IC, 107 denotes a HDD controller, 108 denotes a data bus, 109 denotes a RAM, 110 denotes a microprocessor, 111 denotes an IC servo timing circuit and 112 denotes a head position/motor speed control IC, respectively. The configuration and operations of this HDD is known except that the magnetic characteristics control circuit 105 is mounted in the read/write IC 104. The configurations of these magnetic characteristics control circuit 105 is the same as that of the magnetic characteristics control circuit 31 shown in FIG. 3 or the magnetic characteristics control circuit 81 shown in FIG. 8. If the HDD has protection functions such as clamping diodes that will protect the pinned direction from changing due to possible electric charges applied to the MR elements, the pinned direction control should be executed by temporarily suspending the protection functions.

In this embodiment, the pinned direction control is executed only during self-diagnosis at power-on of the HDD. In case that the spin valve MR element is supplied with sense current in the assist direction, small amount of current toward the assist direction is always supplied during operation of the HDD and therefore, a possibility of inversion of the pinned direction will become low. Thus, in such configuration, this embodiment is very effective. It is apparent that the similar control of the pinned direction can be executed not only at power-on of the HDD but also during the operation of a HDD or at power-off of the HDD.

Another configurations and advantages as well as timing of the pinned direction control are the same as those are in the embodiment shown in FIG. 3 or in the modification shown in FIG. 8.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of controlling magnetic characteristics of a magnetoresistive effect element utilizing exchange coupling magnetization, comprising the steps of:

supplying discrete rectangular waveform currents to said magnetoresistive effect element so as to generate magnetic field in a desired direction and to generate joule heat, the generated magnetic field and the generated joule heat being applied to said magnetoresistive effect element; and controlling a duty ratio of said discrete rectangular waveform currents so that a temperature of said magnetoresistive effect element is controlled under desired temperature change characteristics, whereby a magnetization direction caused by the exchange coupling in said magnetoresistive effect element is aligned to a desired direction.

2. The method as claimed in claim 1, wherein said magnetoresistive effect element has an anti-ferromagnetic layer for producing the exchange coupling, and wherein said method further comprises a step of controlling an amplitude and a duration of a first one of said discrete rectangular waveform currents so that a temperature of said magnetoresistive effect element is controlled at a heating temperature equal to or higher than a temperature at which magnetic order of said anti-ferromagnetic layer will disappear from a macroscopic view point and lower than an upper limit temperature of said magnetoresistive effect element.

3. The method as claimed in claim 2, wherein said duty ratio controlling step is executed after said amplitude and duration controlling step, and wherein said duty ratio controlling step includes a step of controlling the duty ratio of said discrete rectangular waveform currents so that a temperature of said magnetoresistive effect element is gradually decreased from said heating temperature.

4. The method as claimed in claim 1, wherein said magnetoresistive effect element is a spin valve magnetoresistive effect element including a non-magnetic and electrically conductive material layer, first and second ferromagnetic material layers magnetically separated by said non-magnetic material layer and an anti-ferromagnetic material layer deposited on said second ferromagnetic material layer.

5. A method of controlling magnetic characteristics of a magnetic head with a magnetoresistive effect element, magnetic characteristics of said magnetoresistive effect element being controlled in accordance with the method claimed in claim 1.

6. The method as claimed in claim 5, wherein said supplying step and said controlling step are executed at least one time during a fabricating process of said magnetic head or during an evaluation process of electromagnetic conversion characteristics of said magnetic head.

7. The method as claimed in claim 5, wherein said magnetic head is to be assembled in a magnetic disk unit, and wherein said supplying step and said controlling step are executed at least one time during an assembling process of said magnetic disk unit or during an evaluation process of electromagnetic conversion characteristics of said magnetic disk unit.

8. The method as claimed in claim 5, wherein said magnetic head is assembled in a magnetic disk unit, and wherein said supplying step and said controlling step are executed at least one time during a self-diagnosis operation of said magnetic disk unit.

9. A method of controlling magnetic characteristics of a magnetoresistive effect element utilizing exchange coupling magnetization, comprising the steps of:

supplying a rectangular waveform current to said magnetoresistive effect element so as to generate magnetic field in a desired direction and to generate joule heat, the generated magnetic field and the generated joule heat being applied to said magnetoresistive effect element; and controlling a time constant of the falling of said rectangular waveform current so that a temperature of said magnetoresistive effect element is controlled under a desired temperature change characteristics, whereby a magnetization direction caused by the exchange coupling in said magnetoresistive effect element is aligned to a desired direction.

10. The method as claimed in claim 9, wherein said magnetoresistive effect element has an anti-ferromagnetic layer for producing the exchange coupling, and wherein said method further comprises a step of controlling an amplitude and a duration of said rectangular waveform current so that a temperature of said magnetoresistive effect element is controlled at a heating temperature equal to or higher than a temperature at which magnetic order of said anti-ferromagnetic layer will disappear from a macroscopic view point and lower than an upper limit temperature of said magnetoresistive effect element.

11. The method as claimed in claim 10, wherein said time constant controlling step is executed after said amplitude and duration controlling step, and wherein said time constant controlling step includes a step of controlling the time constant of the falling of said rectangular waveform current so that a temperature of said magnetoresistive effect element is gradually decreased from said heating temperature.

12. The method as claimed in claim 9, wherein said magnetoresistive effect element is a spin valve magnetoresistive effect element including a non-magnetic and electrically conductive material layer, first and second ferromagnetic material layers magnetically separated by said non-magnetic material layer and an anti-ferromagnetic material layer deposited on said second ferromagnetic material layer.

13. A method of controlling magnetic characteristics of a magnetic head with a magnetoresistive effect element, magnetic characteristics of said magnetoresistive effect element being controlled in accordance with the method claimed in claim 9.

14. The method as claimed in claim 13, wherein said supplying step and said controlling step are executed at least one time during a fabricating process of said magnetic head or during an evaluation process of electromagnetic conversion characteristics of said magnetic head.

15. The method as claimed in claim 13, wherein said magnetic head is to be assembled in a magnetic disk unit, and wherein said supplying step and said controlling step are executed at least one time during an assembling process of said magnetic disk unit or during an evaluation process of electromagnetic conversion characteristics of said magnetic disk unit.

16. The method as claimed in claim 13, wherein said magnetic head is assembled in a magnetic disk unit, and wherein said supplying step and said controlling step are executed at least one time during a self-diagnosis operation of said magnetic disk unit.

17. A magnetic head device with a magnetoresistive effect element utilizing exchange coupling magnetization, comprising:
means for supplying discrete rectangular waveform currents in stead of a normal sense current to said magnetoresistive effect element so as to generate magnetic field in a desired direction and to generate joule heat, the generated magnetic field and the generated joule heat being applied to said magnetoresistive effect element; and
means for controlling a duty ratio of said discrete rectangular waveform currents so that a temperature of said magnetoresistive effect element is controlled under a desired temperature change characteristics, whereby a magnetization direction caused by the exchange coupling in said magnetoresistive effect element is aligned to a desired direction.

18. The device as claimed in claim 17, wherein said magnetoresistive effect element has an anti-ferromagnetic layer for producing the exchange coupling, and wherein said device further comprises means for controlling an amplitude and a duration of a first one of said discrete rectangular waveform currents so that a temperature of said magnetoresistive effect element is controlled at a heating temperature equal to or higher than a temperature at which magnetic order of said anti-ferromagnetic layer will disappear from a macroscopic view point and lower than an upper limit temperature of said magnetoresistive effect element.

19. The device as claimed in claim 18, wherein said duty ratio controlling means includes means for controlling the duty ratio of said discrete rectangular waveform currents so that a temperature of said magnetoresistive effect element is gradually decreased from said heating temperature.

20. The device as claimed in claim 17, wherein said device further comprises a magnetic head with said magnetoresistive effect element, a first head IC chip for controlling said magnetic head, a second head IC chip for controlling said first head IC chip and a suspension for supporting said magnetic head and said first head IC chip, and wherein said supplying means and said controlling means are formed in said second head IC chip.

21. The device as claimed in claim 17, wherein said magnetoresistive effect element is a spin valve magnetoresistive effect element including a non-magnetic and electrically conductive material layer, first and second ferromagnetic material layers magnetically separated by said non-magnetic material layer and an anti-ferromagnetic material layer deposited on said second ferromagnetic material layer.

22. A magnetic head device with a magnetoresistive effect element utilizing exchange coupling magnetization, comprising:
means for supplying a rectangular waveform current to said magnetoresistive effect element so as to generate magnetic field in a desired direction and to generate joule heat, the generated magnetic field and the generated joule heat being applied to said magnetoresistive effect element; and
means for controlling a time constant of the falling of said rectangular waveform current so that a temperature of said magnetoresistive effect element is controlled under a desired temperature change characteristics, whereby a magnetization direction caused by the exchange coupling in said magnetoresistive effect element is aligned to a desired direction.

23. The device as claimed in claim 22, wherein said magnetoresistive effect element has an anti-ferromagnetic layer for producing the exchange coupling, and wherein said device further comprises means for controlling an amplitude and a duration of said rectangular waveform current so that a temperature of said magnetoresistive effect element is controlled at a heating temperature equal to or higher than a temperature at which magnetic order of said anti-ferromagnetic layer will disappear from a macroscopic view point and lower than an upper limit temperature of said magnetoresistive effect element.

24. The device as claimed in claim 23, wherein said time constant controlling means includes means for controlling the time constant of the falling of said rectangular waveform current so that a temperature of said magnetoresistive effect element is gradually decreased from said heating temperature.

25. The device as claimed in claim 22, wherein said device further comprises a magnetic head with said magnetoresistive effect element, a first head IC chip for controlling said magnetic head, a second head IC chip for controlling said first head IC chip and a suspension for supporting said magnetic head and said first head IC chip, and wherein said supplying means and said controlling means are formed in said second head IC chip.

26. The device as claimed in claim 22, wherein said magnetoresistive effect element is a spin valve magnetoresistive effect element including a non-magnetic and electrically conductive material layer, first and second ferromagnetic material layers magnetically separated by said non-magnetic material layer and an anti-ferromagnetic material layer deposited on said second ferromagnetic material layer.

27. A magnetic disk unit having a magnetic head with a magnetoresistive effect element utilizing exchange coupling magnetization, comprising:

means for supplying discrete rectangular waveform currents in stead of a normal sense current to said magnetoresistive effect element so as to generate magnetic field in a desired direction and to generate joule heat, the generated magnetic field and the generated joule heat being applied to said magnetoresistive effect element; and means for controlling a duty ratio of said discrete rectangular waveform currents so that a temperature of said magnetoresistive effect element is controlled under a desired temperature change characteristics, whereby a magnetization direction caused by the exchange coupling in said magnetoresistive effect element is aligned to a desired direction.

28. The unit as claimed in claim 27, wherein said magnetoresistive effect element has an anti-ferromagnetic layer for producing the exchange coupling, and wherein said unit further comprises means for controlling an amplitude and a duration of a first one of said discrete rectangular waveform currents so that a temperature of said magnetoresistive effect element is controlled at a heating temperature equal to or higher than a temperature at which magnetic order of said anti-ferromagnetic layer will disappear from a macroscopic view point and lower than an upper limit temperature of said magnetoresistive effect element.

29. The unit as claimed in claim 28, wherein said duty ratio controlling means includes means for controlling the duty ratio of said discrete rectangular waveform currents so that a temperature of said magnetoresistive effect element is gradually decreased from said heating temperature.

30. The unit as claimed in claim 27, wherein said magnetoresistive effect element is a spin valve magnetoresistive effect element including a non-magnetic and electrically conductive material layer, first and second ferromagnetic material layers magnetically separated by said non-magnetic material layer and an anti-ferromagnetic material layer deposited on said second ferromagnetic material layer.

31. A magnetic disk unit having a magnetic head with a magnetoresistive effect element utilizing exchange coupling magnetization, comprising:

means for supplying a rectangular waveform current to said magnetoresistive effect element so as to generate magnetic field in a desired direction and to generate joule heat, the generated magnetic field and the generated joule heat being applied to said magnetoresistive effect element; and means for controlling a time constant of the falling of said rectangular waveform current so that a temperature of said magnetoresistive effect element is controlled under a desired temperature change characteristics, whereby a magnetization direction caused by the exchange coupling in said magnetoresistive effect element is aligned to a desired direction.

32. The unit as claimed in claim 31, wherein said magnetoresistive effect element has an anti-ferromagnetic layer for producing the exchange coupling, and wherein said unit further comprises means for controlling an amplitude and a duration of said rectangular waveform current so that a temperature of said magnetoresistive effect element is controlled at a heating temperature equal to or higher than a temperature at which magnetic order of said anti-ferromagnetic layer will disappear from a macroscopic view point and lower than an upper limit temperature of said magnetoresistive effect element.

33. The unit as claimed in claim 32, wherein said time constant controlling means includes means for controlling the time constant of the falling of said rectangular waveform current so that a temperature of said magnetoresistive effect element is gradually decreased from said heating temperature.

34. The unit as claimed in claim 31, wherein said magnetoresistive effect element is a spin valve magnetoresistive effect element including a non-magnetic and electrically conductive material layer, first and second ferromagnetic material layers magnetically separated by said non-magnetic material layer and an anti-ferromagnetic material layer deposited on said second ferromagnetic material layer.

* * * * *